United States Patent
Watanabe et al.

(10) Patent No.: US 6,573,116 B2
(45) Date of Patent: Jun. 3, 2003

(54) RIDGE TYPE SEMICONDUCTOR LASER OF LATERALLY-COUPLED DISTRIBUTED FEEDBACK AND METHOD OF MANUFACTURING THE SAME

(75) Inventors: Yoshiaki Watanabe, Tsurugashima (JP); Kiyoshi Takei, Tsurugashima (JP); Nong Chen, Tsurugashima (JP); Kiyofumi Chikuma, Tsurugashima (JP)

(73) Assignee: Pioneer Electronic Corporation, Tokyo-to (JP)

(*) Notice: Subject to any disclaimer, the term of this patent is extended or adjusted under 35 U.S.C. 154(b) by 7 days.

(21) Appl. No.: 09/908,560

(22) Filed: Jul. 20, 2001

(65) Prior Publication Data

US 2001/0046246 A1 Nov. 29, 2001

Related U.S. Application Data

(62) Division of application No. 09/270,827, filed on Mar. 18, 1999, now Pat. No. 6,292,503.

(30) Foreign Application Priority Data

Mar. 20, 1998 (JP) ............................................. 10-72866

(51) Int. Cl.[7] ............................................... H01L 21/00
(52) U.S. Cl. ............................. 438/32; 438/22; 438/32; 438/39; 438/40; 438/41
(58) Field of Search ........................ 438/22, 29, 32, 438/39, 40, 41

(56) References Cited

U.S. PATENT DOCUMENTS

| | | | | |
|---|---|---|---|---|
| 5,298,456 A | * | 3/1994 | Unozawa | 438/40 |
| 5,304,507 A | * | 4/1994 | Unozawa | 438/40 |
| 5,563,902 A | * | 10/1996 | Xu et al. | 372/46 |
| 5,793,913 A | | 8/1998 | Kovacic | 385/49 |
| 5,982,804 A | | 11/1999 | Chen et al. | 372/96 |

FOREIGN PATENT DOCUMENTS

| | | | | |
|---|---|---|---|---|
| JP | 405095170 A | * | 4/1993 | H01L/27/15 |
| JP | 411312843 A | * | 11/1999 | H01L/21/205 |

OTHER PUBLICATIONS

Watanabe et al, IEEE Photonics Technology Letters, vol. 10 No. 12 Dec. 1998, 1688–1690.*
R.D. Martin et al.; "CW Performance of an InGaAs–GaAs–AlGaAs Laterally–Coupled Distributed Feedback (LC–DFB) Ridge Laser Diode"; IEEE Photonics Technology Letters, vol. 7, No. 3, pp 244–246; Mar. 1995.

* cited by examiner

Primary Examiner—Matthew Smith
Assistant Examiner—V. Yevsikov
(74) Attorney, Agent, or Firm—Morgan, Lewis & Bockius LLP

(57) ABSTRACT

There is provided a method of manufacturing a ridge type LC-DFB semiconductor laser in which a laser substrate having a cladding layer made of a material for a ridge stripe formed on an active layer made of semiconductor. A stripe mask is formed on the cladding layer to form two lateral flat portions from the cladding layer, by a selective wet etching, so as to form a ridge stripe protruding therefrom and having a flat top portion at which the stripe mask capped. A grating mask is formed on the two lateral flat portions, side walls of the ridge stripe and the stripe mask. The grating mask has a periodic structure in the direction in which the ridge stripe extends. The two lateral flat portions and the side walls of the ridge stripe are dry-etched through the grating mask and then the two lateral flat portions and the side walls of the ridge stripe are wet-etched to form a grating of the material for the ridge stripe on the two lateral flat portions, the side walls of the ridge stripe and the active layer, so as to define a bracket grating portion adjacent to the ridge stripe.

11 Claims, 5 Drawing Sheets

RIDGE TYPE SEMICONDUCTOR LASER OF LATERALLY-COUPLED DISTRIBUTED FEEDBACK AND METHOD OF MANUFACTURING THE SAME

This is a divisional of application application Ser. No. 09/270,827 filed on Mar. 18, 1999, now U.S. Pat. No. 6,292,503

BACKGROUND OF THE INVENTION

1. Field of the Invention

The present invention relates to a method of fabricating an optical integrated circuit and, more particularly, to a ridge type semiconductor laser of laterally-coupled distributed feedback (LC-DFB) and a method of manufacturing the same.

2. Description of the Related Art

Distributed feedback (DFB) semiconductor lasers are known as devices which can be used in the fields of optical communication systems such as optical CATVs, pumping light sources for SHG short-wave lasers for high-density information recording or small solid-state lasers, and optical measurement. The DFB semiconductor laser is used for a light source together with the other semiconductor devices.

Conventional distributed feedback semiconductor lasers are probably formed by using two or more steps of epitaxial growth. In a ridge type DFB semiconductor laser formed using two or more steps of epitaxial growth, a grating (diffraction grating) is provided in a laser waveguide layer and thereafter another layer is formed on the waveguide on an epitaxial growth basis.

Recently, in order to avoid the complicated epitaxial growth in two or more steps, the so-called single-growth distributed feedback semiconductor lasers have been developed which are fabricated using one single step of epitaxial growth, i.e., which does not involve any second epitaxial growth.

For example, in R. D. Martin et al. "CW Performance of an InGaAs-GaAs-AlGaAs Laterally-Coupled Distributed Feedback (LC-DFB) Ridge Laser Diode" IEEE Photonics Technology Letters, Vol. 7, No. 3, pp 244–246, March 1995, an InGaAs-GaAs-AlGaAs distributed feedback semiconductor laser is disclosed in which an active layer and a cladding layer are formed on a substrate by means of epitaxial growth; a ridge stripe is formed on the cladding layer; and a grating is provided on the top portion of the ridge stripe and on flat portions on both sides thereof. In methods of manufacturing such a laterally-coupled distributed feedback semiconductor laser, the grating is formed on the entire region of the substrate including the top portion of the ridge type waveguide by means of direct writing with electron beams (EB). In a DFB semiconductor laser, in general, a periodic structure is formed which undergoes a variation in shape having a period Λ in tile direction in which the laser beam propagates. This results in a periodic variation of the index of refraction which in turn results in an increase in the reflectivity at a wavelength for which the phases of periodically reflected beams match (Bragg reflection), thereby causing laser oscillation. Therefore, the oscillation frequency of a distributed feedback semiconductor laser is determined by the period Λ of the periodic structure and, in general, a single longitudinal mode is obtained if the equation $\Lambda = m\lambda/2n$ is satisfied where m represents an integral number; λ represents the oscillation wavelength (in vacuum); and n represents the index of refraction of the laser medium. While oscillation generally occurs in the vicinity of wavelength of the Bragg reflection, the period Λ is determined considering the refractive indices, thicknesses, and aspect ratios of the $In_{1-x}Ga_xAs_{1-y}P_y$ active layer and the cladding layer of the InP ridge stripe material, the reflectivity of the resonator (cleavage planes), and even the lateral optical coupling coefficient.

In the fabrication of such a DFB semiconductor laser, a longitudinally extending ridge stripe is formed by an etching process on the cladding layer and then the grating each line crossing the ridge stripe is formed on and around the ridge stripe. The dry etching process is almost employed for the method for forming the grating because it is excellent in controllability.

However, there are many failures in making the grating with a preferable shape on the side wall of the ridge stripe since it is difficult to make a mask proof against damage from the dry etching and to transfer the mask onto the side wall. The difficulty to fabricate the grating is a serious matter since the property of the DFB semiconductor laser is subject to the shape or status of each line in the grating at the foot of the ridge stripe. The dry etching process may also damage the surface of the substrate and thereby our apprehensions for inferiority of the property of the DFB semiconductor laser remains. On the other hand, the wet etching process hardly damages the surface of the substrate of semiconductor, but it is inferior in controllability because the property of the wet etching is apt to be subject to the crystal plane of semiconductor. The individual use of the wet etching is not suitable for the fabrication of the grating at the foot of the ridge stripe in the ridge type LC-DFB semiconductor laser.

Accordingly, it is very difficult to obtain a secure optical coupling between the grating and the guided light in the ridge stripe waveguide at the foot thereof in the conventional ridge type LC-DFB semiconductor laser.

SUMMARY OF THE INVENTION

The present invention confronts the above-described problem, and it is an object of the present invention to provide a laterally-coupled DFB semiconductor laser and a method of manufacturing the same, having a secure optical coupling between the grating and the guided light in the ridge stripe waveguide at the foot thereof.

The object is achieved by a method of manufacturing a ridge type semiconductor laser of laterally-coupled distributed feedback having an active layer made of semiconductor; a cladding layer formed on said active layer; a ridge stripe formed to protrude from said cladding layer; and a grating having a periodic structure in the direction in which the ridge stripe extends and formed on the side walls of the ridge stripe and on flat portions on both sides thereof. This method according to the invention comprises the steps of:

forming a stripe mask having a predetermined width on a cladding layer made of a material for a ridge stripe formed on an active layer made of semiconductor formed on a laser substrate, to form two lateral flat portions from said cladding layer, by a selective wet etching, so as to form a ridge stripe protruding therefrom and having a flat top portion at which the stripe mask capped;

forming a grating mask on said two lateral flat portions, side walls of said ridge stripe and said stripe mask, said grating mask having a periodic structure in the direction in which the ridge stripe extends; and dry-etching through said grating mask said two lateral flat portions and said side walls of the ridge stripe and then wet-etching said two lateral flat portions and said side walls of the ridge stripe to form a grating made of said material for the ridge stripe on said two lateral flat portions, said side walls of the ridge stripe and said active layer, so as to define a bracket grating portion adjacent to the ridge stripe.

By the present invention, in the step of forming the ridge stripe, the ridge stripe is formed by the wet-etching so that its longitudinal axis of the ridge structure extends parallel to a crystal orientation or direction e.g., a <0$\bar{1}$1>-direction in crystal of the laser substrate. As a result, the ridge stripe have slopes at the side walls each gently down at an angle of 0 to 55°. This slope angle is gentler than a slope angle about 9020 obtained by only the dry-etching in comparison with that of the conventional ridge stripe. This gentle slope surface at the side wall relaxes the conditions for forming the grating mask, particularly a resist pattern film for the direct electron beam (EB) writing. Therefore, the transferring of pattern may be performed securely in the next step of forming the grating. Moreover, by the dry-etching, the gentle slope side walls of the ridge and both the flat portions of the first cladding layer are deeply dug as valleys between lines of the grading and after that, the wet-etching is performed, so that vertical side walls of crystal face appear each standing up in about vertical angle which define the side wall of the ridge stripe. In this case, each side wall of protruding lines of the grating having (0$\bar{1}$1) appears which is a vertical side walls of crystal face and at the same time the damaged portions caused by the dry-etching are removed at the other portions of the grating because of its high etching rate. As a result, a deep grating free from damage is formed as an ideal grating adjacent to an emitting region in the active layer in the laser device.

In a first aspect of the invention of the method of manufacturing a semiconductor laser, the method further comprises a step of forming a contact layer on the cladding layer to be connected to an electrode, wherein the contact layer disposed under the stripe mask is used for a second mask proofing against the selective wet etching in the step of forming the ridge stripe.

In a second aspect of the invention of the method of manufacturing a semiconductor laser, the method further comprises a step of forming a wet-etching termination layer for terminating a wet-etching within the cladding layer so that the wet-etching termination layer is sandwiched between a pair of cladding layers. This interposing of the wet-etching termination between the cladding layers may facilitate the grating formation without exposing of the active layer of semiconductor and the guiding layer being apt to have occurrence of non-emitting recombining portions at the exposed surface.

In a third aspect of the invention of the method of manufacturing a semiconductor laser, the wet-etching termination layer is made of InGaAsP or InGaAs.

In a fourth aspect of the invention of the method of manufacturing a semiconductor laser, said active layer is a bulk layer, a single quantum well layer, or a multiple quantum well layer mainly composed of $In_{1-x}Ga_xAs_{1-y}P_y$ (where $0 \leq x < 1, 0 \leq y \leq 1$); and said cladding layer is made of InP.

In a fifth aspect of the invention of the method of manufacturing a semiconductor laser, said contact layer is made of InGaAsP or InGaAs.

In a sixth aspect of the invention of the method of manufacturing a semiconductor laser, said selective wet etching for said cladding layer of InP is performed using a hydrochloric acid type etchant.

In a seventh aspect of the invention of the method of manufacturing a semiconductor laser, said step of forming a grating mask includes;
a step of forming a protective film and a resist layer in this order to cover on said two-lateral flat portions, the side walls of said ridge stripe and said stripe mask; and
a step of forming a latent image of a grating mask having a periodic structure in the direction in which the ridge stripe extends on said resist layer and then forming a grating mask by developing said resist layer.

In an eighth aspect of the invention of the method of manufacturing a semiconductor laser, said step of forming the latent image includes the step of forming said latent image using a direct electron beam writing process.

In a ninth aspect of the invention, the method of manufacturing a semiconductor laser further comprises;
a step of removing said protective film and said stripe mask after the forming step of said grating;
a step of forming to form an insulator layer on an entire surface of said grating and said flat top portion; and
performing etching to expose only said flat top portion on said insulator layer and, thereafter, forming an electrode on said flat top portion.

Furthermore, a ridge type semiconductor laser of laterally-coupled distributed feedback according to the invention comprises;
an active layer made of semiconductor;
a cladding layer formed on said active layer;
a ridge stripe formed to protrude from said cladding layer; and
a grating having a periodic structure in the direction in which the ridge stripe extends and formed on side walls of the ridge stripe and on flat portions on both sides thereof, wherein said grating has bracket grating portions defined adjacent to the ridge stripe and each having a slope surface extending from a flat top portion of the ridge stripe to a top face the grating and coupling the side walls of the ridge stripe and the grating.

In a first aspect of a ridge type semiconductor laser of laterally-coupled distributed feedback according to the invention, said active layer is a bulk layer, a single quantum well layer, or a multiple quantum well layer mainly composed of $In_{1-x}Ga_xAs_{1-y}P_y$ (where $0 \leq x < 1, 0 \leq y \leq 1$); and said cladding layer is made of InP.

In a second aspect of a ridge type semiconductor laser of laterally-coupled distributed feedback according to the invention, the laser further comprises a wet-etching termination layer for terminating a wet-etching within the cladding layer so as to be sandwiched between a pair of cladding layers.

In a third aspect of a ridge type semiconductor laser of laterally-coupled distributed feedback according to the invention, the wet-etching termination layer is made of InGaAsP or InGaAs.

According to the present invention, the grating can be uniformly even at the step portions between the ridge stripe and the flat portions. Specifically, the present invention takes advantageous use of the selective wet-etching and the dry-etching thereafter to achieve the fabrication of the bracket grating portions for coupling the side walls of the ridge stripe and the grating and each having a slope side wall surface, thereby making it possible to manufacture laterally-coupled DFB ridge semiconductor lasers with high yield, at low cost, and with a high quality and secure optical laterally-coupling.

DETAILED DESCRIPTION OF PREFERRED EMBODIMENTS

A description for the invention will now be made with reference to accompanying drawings.

A laterally-coupled DFB ridge type semiconductor laser of InGaAsP/InP type is manufactured by means of the metal organic chemical vapor deposition (MOCVD) using a gas of an organometallic compound gas.

1. Film Fabrication on a Substrate

Figure 1:
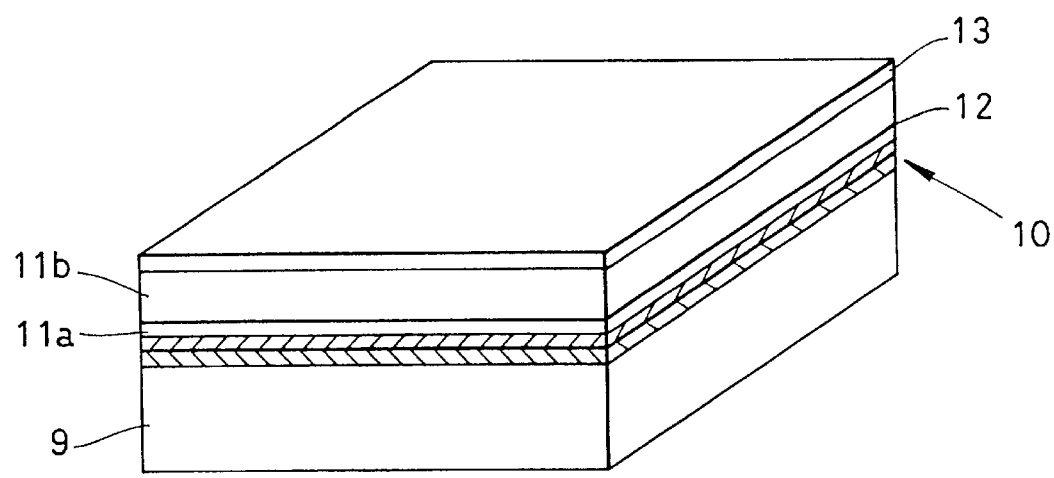
FIGS. 1, 2, 4, 5 and 9 to 11 are schematic perspective views each showing a substrate of a laser at a step of manufacturing a laterally-coupled DFB semiconductor laser of an embodiment according to the invention.

As shown in FIG. 1, there is first prepared a wafer of a n-InP crystalline substrate 9 having a predetermined plane orientation (100). To clean the surface of the wafer a chemical etching is performed. After that, a first guide layer, a guide layer and a second guide layer which have $In_{1-x}Ga_xAs_{1-y}P_y$ (where $0 \leq x < 1$, $0 \leq y \leq 1$); respectively are formed on the cleaned surface of the wafer 9 to fabricate an SCH (separate confinement heterostructure) active layer region 10 of semiconductor structure, by using predetermined processes such as epitaxial growth, liquid phase epitaxial growth, metal organic chemical vapor deposition, molecular beam epitaxial growth. Namely, the active layer 10 may be a bulk layer, a single quantum well layer, or a multiple quantum well layer which is mainly composed of $In_{1-x}Ga_xAs_{1-y}P_y$ (where $0 \leq x < 1$, $0 \leq y \leq 1$). Next, a first cladding layer 11a made of a material for a ridge stripe such as p-InP is deposited on the active layer 10. After that, a wet-etching termination layer 12 made of p-InGaAsP or p-InGaAs for terminating a wet-etching is deposited on the cladding layer 11a. Next, a second cladding layer 11b made of a material for a ridge stripe such as p-InP is also deposited on the wet-etching termination layer 12 and then a contact layer 13 made of p-InGaAs is deposited on the cladding layer 11b. Thus, a laser substrate having a laser structure is formed.

2. Fabrication of a Ridge Stripe

A ridge of semiconductor is processed from the cladding layer 11b in such a manner that a $SiO_2$ film is patterned with a stripe through the photolithography using a photoresist. Namely, a two step etching is used as follows: first, a stripe mask 14 made of $SiO_2$ with a predetermined width is formed on the contact layer 13 so as to provide a ridge stripe which extends in a predetermined direction e.g., a <0$\overline{1}$1> direction of the laser substrate. After that, the contact layer 13 is dry-etched up to the interface of the cladding layer 11b. Next, the cladding layer 11b of a ridge stripe material is wet-etched to form two side flat portions F and a ridge stripe 15 protruding therefrom to a predetermined height and having a flat top portion T, as shown in FIG. 2.

Figure 2:
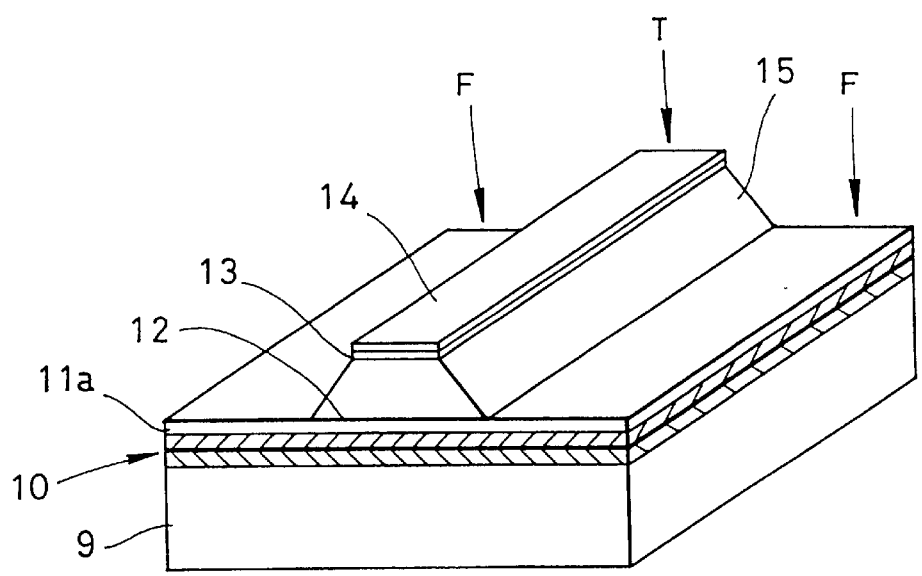

As seen from FIG. 2, the formed ridge stripe 15 at the top of which the stripe mask 14 capped has two slopes at the side walls each gently down to both the flat portions F. This shape is obtained in such a manner that, in the first step, the dry-etching processes only the contact layer 13 and then, in the second step, the wet-etching processes only the cladding layer 11b, although the contact layer 13 and the cladding layer 11b are dry-etched all together in the prior art.

Figure 3:
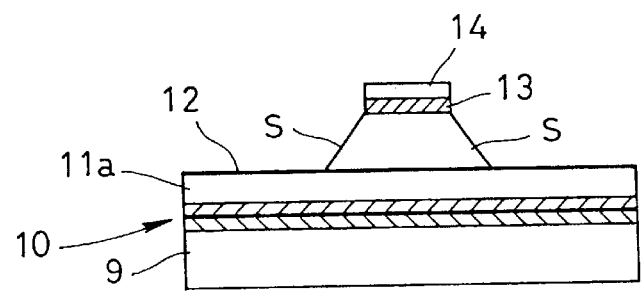
FIG. 3 is a partially enlarged schematic cross-sectional view showing a substrate of a laser substrate at a step of manufacturing the laterally-coupled DFB semiconductor laser of an embodiment according to the invention.

Conventionally, since the dry-etching penetrating the two layers is a non-selective etching, the height of the ridge stripe is subject to the stableness of the etching rate of the dry-etching in bulk and thereby the variety of the ridge height brings the fluctuation of light-restriction in the resultant ridge stripe so that the optical coupling coefficient which is one of significant parameters is changed from a wanted value. On the other hand, as shown in FIG. 3, since the formed ridge stripe 15 is defined by the interface of the wet-etching termination layer 12 and the gentle slope side walls S of crystal faces which are automatically formed by the selective wet-etching in the invention, the precision of etching may be improved and thus the stableness of output light of the resultant semiconductor laser may be achieved. In addition, there may be eliminated the problem that the damage or roughness of the side wall surfaces influencing the next step and the property of the resultant device is caused by the dry etching process.

3. Patterning of Grating Mask by the Electron Beam Lithography

Figure 4:
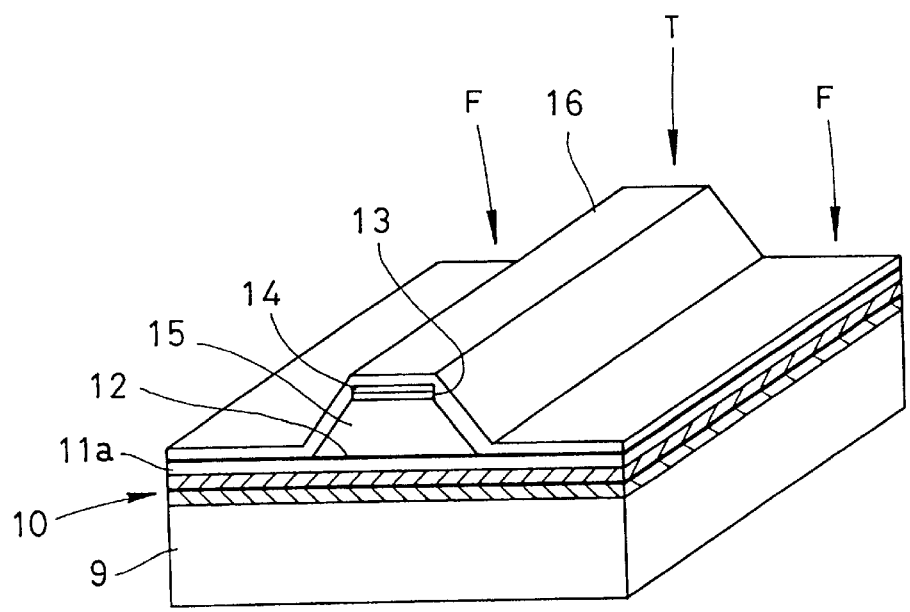

Next, as shown in FIG. 4, a protective film 16 made of $SiO_2$ or the like is formed by the sputtering method or the like in such a manner that the film is spread over the two flat portions F of the first cladding layer 11a and the flat top portion T of the ridge stripe 15. The protective film 16 prevents the desorption of phosphorus and also serves as an etching mask. The protective film 16 is also effective in providing a uniform resist film for the electron beam (EB) writing with a high resolution at the next step which requires baking at a high temperature.

Figure 5:
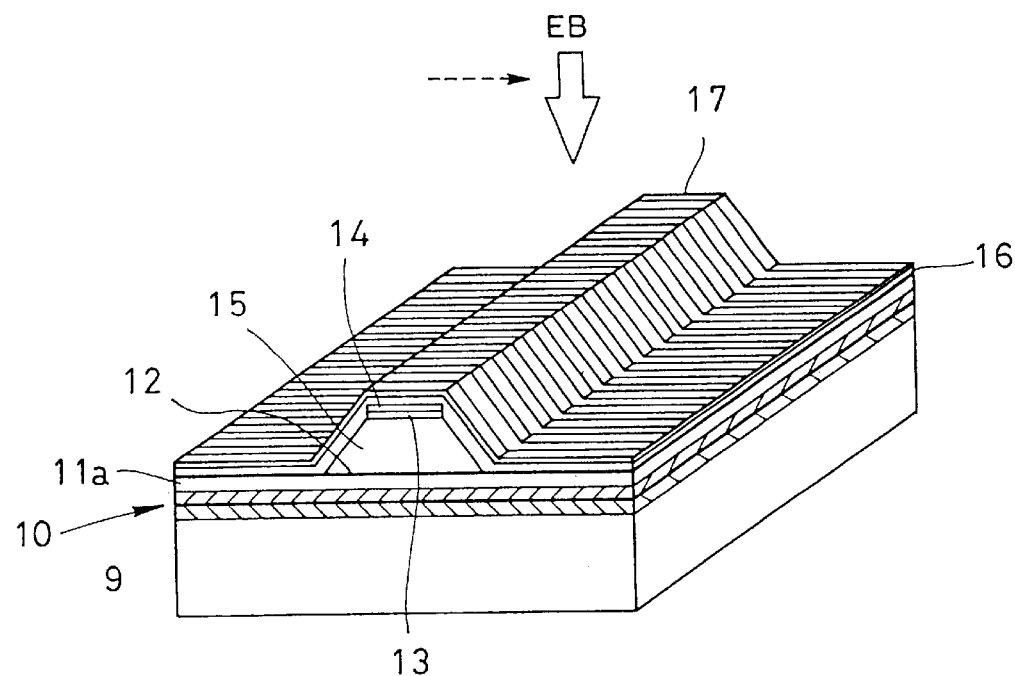

Next, the protective film 16 is coated with a resist fluid for EB writing that extends in the regions of both lateral flat portions F and the flat top portion T and, thereafter, baking is performed to form a cured resist layer 17. Then, as shown in FIG. 5, EB writing is performed on the entire surface of the resist layer 17 including the top portion of the ridge stripe to provide lines which periodically extend in the crystal orientation direction in accordance with a desired oscillation frequency of the laser, thereby forming a latent image of a grating mask in a periodic structure which undergoes a variation of shape having a period $\Lambda$ in the direction in which the ridge stripe extends, on the resist layer 17.

Figure 6:
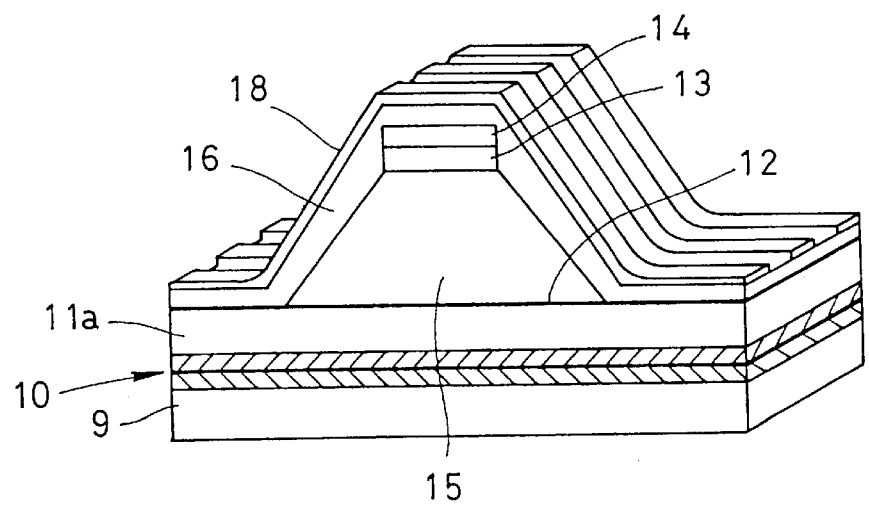
FIGS. 6 and 8 are schematic perspective views partially enlarged each showing a substrate of a laser at a step of manufacturing a laterally-coupled DFB semiconductor laser of an embodiment according to the invention.

Next, the development of the latent image of grating mask is carried out and then, as shown in FIG. 6, the grating mask 18 is formed on the protective film 16.

Figure 7:
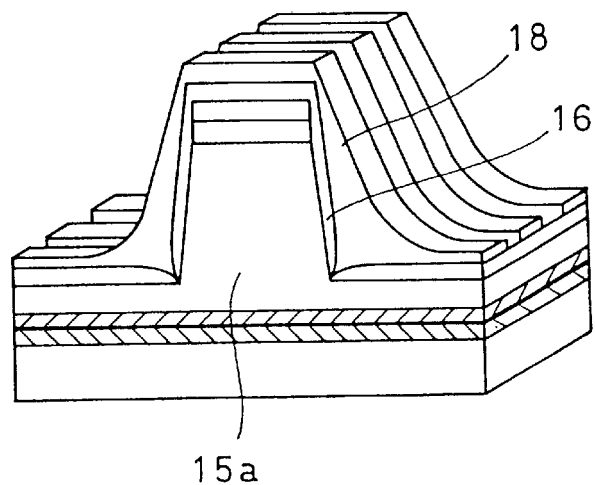
FIG. 7 is a schematic perspective view partially enlarged showing a substrate of a laser at a step of manufacturing a laterally-coupled DFB semiconductor laser by using only a conventional dry-etching process.

To compare the invention with the prior art, FIG. 7 shows a ridge 15a standing up vertically from the substrate which is formed by only using the dry-etching. In this case, a $SiO_2$ protective film 16 formed by sputtering is not continuous at the foot of the ridge 15a. In addition, the grating mask 18 has very thick portions at the foot of the ridge 15a because a spin-coated resist fluid for EB writing is accumulated at the particular foot portion. Therefor the control of the EB writing condition is strictly preformed. These are problems in the manufacturing process. However, according to the invention, such problems are absent as shown in FIG. 6. This is because the ridge 15 has the gentle slope side walls S, so that the protective film 16 is continuous even at the foot of the ridge and the grating mask 18 has a homogenous thickness without any thick portion and then the control of the EB writing condition is relaxed.

4. Fabrication of Grating

Figure 8:
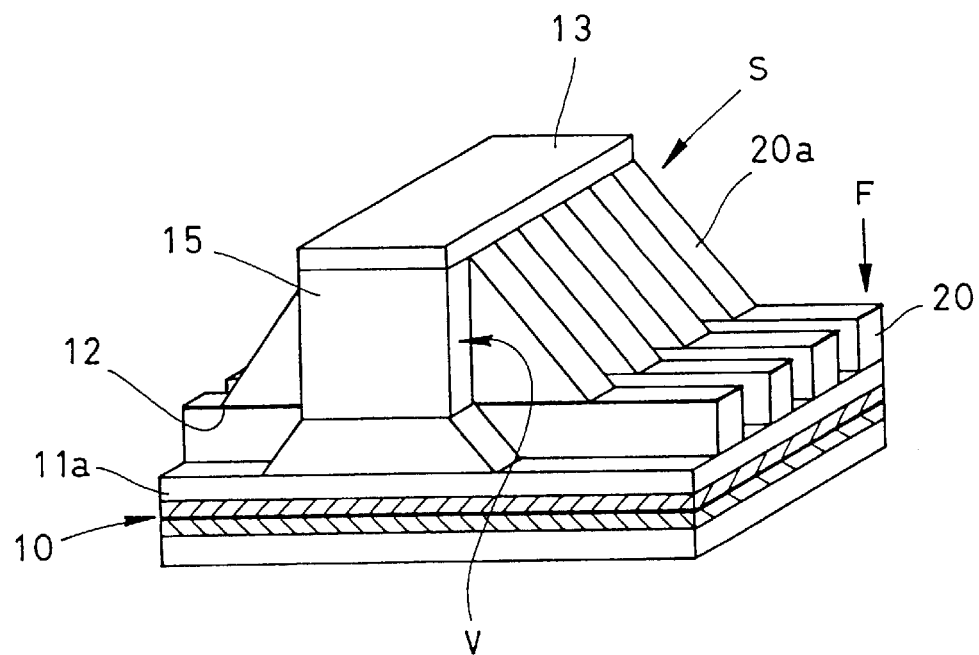

A step of forming a grating is carried out in which lines of the grating are transferred through openings of the grating mask to the $SiO_2$ protective film 16 by means of $CF_4$ dry etching so that the both lateral flat portions of the first cladding layer a are selectively etched to transform partially the first cladding layer into a grating 20. After that, the protective film 16 is wet-etched and removed by using a hydrochloric acid type etchant, as shown in FIG. 8. In the dry-etching process, the contact layer 13 disposed on the flat top portion T of the ridge stripe is not etched by the dry-etching, because the total thickness of the lamination composed of both the stripe mask 14 and the protective film 16 disposed on the flat top portion T of the ridge stripe is grater than the thickness of the protective film 16 disposed on the flat portions F of the first cladding layer. Such difference in thickness is equal to that of the stripe mask 14. Although the contact layer 13 survives the dry-etching, the gentle slope side walls S of the ridge 15 and both the flat portions F of the first cladding layer are dry-etched via the mask so that deep valleys are dug each having a vertical side wall V standing up in about vertical which define the side wall of the ridge stripe 15. Namely, at the same time, ends of line of the grating 20a are deformed as a bracket shape adjacent to the ridge. In this way, each bracket grating portion 20a has a slope surface extending from the flat top portion T of the ridge stripe to the top face the grating 20 and coupling the vertical side wall V of the ridge stripe and the grating 20.

Observation of an SEM picture taken on the result of the above-described grating formation step proves that grating structures having widths spanning the regions of the substrate on both sides of the ridge stripe and a period on the order of sub-micrometers are formed with uniformity maintained even in the vertical side wall of the ridge stripe.

Conventionally, only the dry-etching have been used for the fabrication of grating. Therefor, the etched depths between adjacent lines of the grating are not stable and the damage caused by the dry-etching influences the active layer region of laser structure adjacent to the dry-etched portion. However, according to the invention, these problems do not occur because the grating is formed by the wet-etching after the dry-etching.

Although there is a difficulty to form a wanted grating shape at the side wall of the ridge stripe in the prior art, such a difficulty is eliminated by the present invention comprising a step of forming a ridge stripe having gentle slope side walls; and a step of performing a two step etching process consisting of dry and wet etchings and thereby a very deep grating up to the side wall of the ridge stripe is formed so that a high optical coupling coefficient between the grating and guided light in the ridge stripe is achieved.

5. Burying with Insulator and Fabrication of Electrodes

Figure 9:
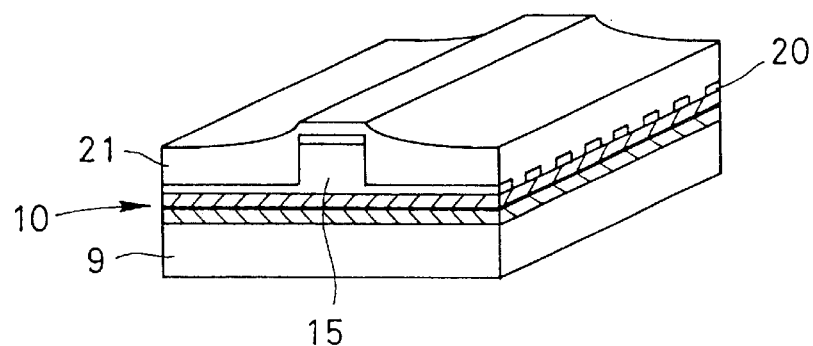

Next, as shown in FIG. 9, a silicon compound such as Spin-On-Glass is applied to the entire region where the ridge stripe 15 and the grating 20 are located and is cured to form an inorganic protective layer (or an insulator layer) 21. The inorganic protective layer 21 which is a protective film for blocking a current is formed thinner on the flat top portion of the ridge stripe than on the top portion of the grating 20.

Figure 10:
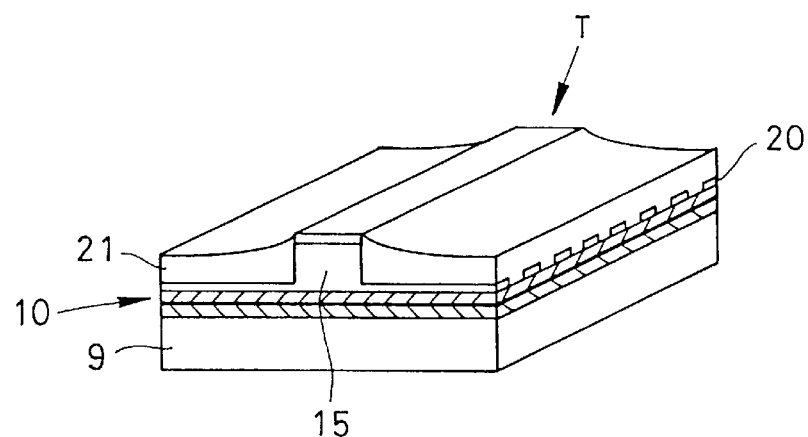

Thereafter, as shown in FIG. 10, the inorganic protective layer 21 is removed until the top portion of the ridge stripe 15 is exposed. It is possible to expose only the flat top portion T of the ridge stripe 15 by performing dry etching where there is a difference between the thicknesses of the inorganic protective film 21 on the flat top portion of the ridge stripe and on the top portion of the grating 20. This is the formation of an electrode window using the so-called self-alignment process.

Figure 11:
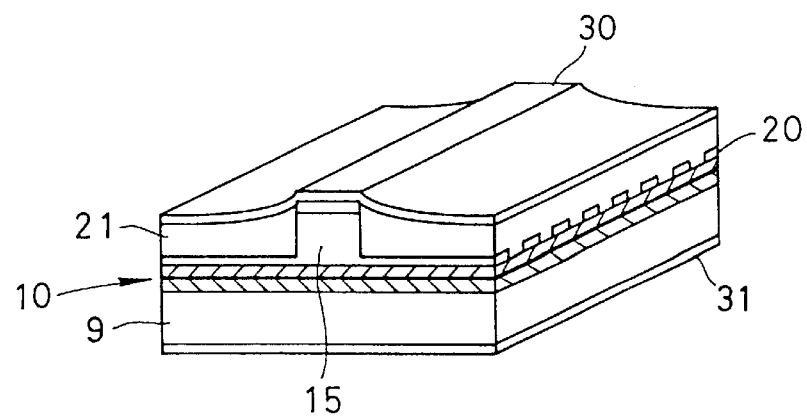

Next, as shown in FIG. 11, an electrode 30 is formed on the contact layer at the top portion T of the ridge stripe thus exposed. The ridge stripe top portion T is flat because there is no grating. It is therefore possible to form an electrode free from poor contact. Further, an opposite electrode 31 is formed on the opposite surface of the substrate 9 of n-InP. An ohmic contact metal having no rectifying property is chosen for those electrodes. In general, AuGeNi and CrAu electrodes are formed using vacuum deposition on the n-type and p-type sides, respectively.

In this laser, the active layer is constituted by the bulk, and the end faces are cleavage planes. The width of the ridge stripe is 5 $\mu$m and may be 2 $\mu$m or less if stronger coupling is desired. Although the grating is of the third order, it may be of the first order. The grating depth is one-fourth or one-third of the period, but it may be smaller than one-third of the period. In this way, predetermined steps including burying the ridge with the insulator and fabricating electrodes on the n-type and p-type sides are performed to complete the a ridge type semiconductor laser of laterally-coupled distributed feedback.

In order to see the characteristics of the laterally-coupled DFB semiconductor laser obtained as described above, an examination was made on spectral distribution showing the oscillation wavelength versus relative intensity and on the injected current versus light output. As a result, it was recognized that the laterally-coupled DFB semiconductor laser allows highly efficient injection of a current into the device and provides single mode emission.

In the case that the wet-etching termination layer is provided in the laser device as mentioned above, it is preferable that the wet-etching is continued until the wet-etching termination layer adjacent to the ridge is removed by the etching and the first cladding layer appears. It is allowable that no wet-etching termination layer is used in the present invention, because the gentle slope side walls of the ridge stripe changing gradually its slope angle is formed by the wet-etching and thereby the condition of EB lithography is relaxed so as to obtain the stable transferring of the grating in the next step.

In the structure of DFB semiconductor laser according to the present invention, the optical coupling between the grating and guided light in the ridge stripe is mainly subject to the index coupling therebetween. On the other hand, since the width of the active layer region into which electrical current is injected is modulated by the grating, it implies that such a region generating an optical gain is modulated by the grating. Therefor, the DFB semiconductor laser according to the present invention also demonstrates the function of the gain coupling.

Accordingly, the optical coupling between the grating and guided light in the ridge stripe is a combination optical coupling consisting of index coupling and the gain coupling in the ridge type semiconductor laser of laterally-coupled distributed feedback according to the present invention.

As described above, according to the present embodiment, the grating with clear shape lines may be integratedly formed not only on the flat portions on both the sides of the ridge stripe but also up to the side walls of the ridge stripe. As a result of the integrated grating up to the side walls of the ridge stripe, the region of the grating becomes wide and then the evanescent wave coupling is achieved widely, so that a ridge type LC-DFB semiconductor laser obtains a high optical coupling coefficient and an efficient rate of lateral optical coupling. Further, in the invention, since the formation of the grating is finished by using a selective wet etching process after dry-etching, the damaged portions caused by the dry-etching are removed. Still further, undesirable scattering light is restricted in the ridge stripe since the side walls thereof is defined with crystal faces of semiconductor through a finish of wet etching of the invention. In addition, according to the present embodiment, the precision of etching may be improved by the finish of wet etching process after the dry-etching deciding the general dimension of device, so that the yield of the laser devices is enlarged. Since the top portion of a ridge type laser waveguide can be made smooth, it can make a better contact with an electrode.

What is claimed is:

1. A method of manufacturing a ridge type semiconductor laser of laterally-coupled distributed feedback having an active layer made of semiconductor; a cladding layer formed on said active layer; a ridge stripe formed to protrude from said cladding layer; and a grating having a periodic structure in the direction in which the ridge stripe extends and formed on the side walls of the ridge stripe and on flat portions on both sides thereof, comprising the steps of:

forming a stripe mask having a predetermined width over a cladding layer made of a material for a ridge stripe formed on an active layer made of semiconductor formed on a laser substrate, to form two lateral flat portions from said cladding layer, by a selective wet etching, so as to form a ridge stripe protruding therefrom and having a flat top portion at which the stripe mask capped;

forming a grating mask on said two lateral flat portions, side walls of said ridge stripe and said stripe mask, said grating mask having a periodic structure in the direction in which the ridge stripe extends; and dry-etching through said grating mask said two lateral flat portions and said side walls of the ridge stripe and then wet-etching said two lateral flat portions and said side walls of the ridge stripe to form a grating made of said material for the ridge stripe on said two lateral flat portions, said side walls of the ridge stripe and said active layer, so as to define a bracket grating portion adjacent to the ridge stripe.

2. A method of manufacturing a semiconductor laser according to claim 1, further comprising a step of forming a contact layer on the cladding layer to be connected to an electrode, wherein the contact layer disposed under the stripe mask is used for a second mask proofing against the selective wet etching in the step of forming the ridge stripe.

3. A method of manufacturing a semiconductor laser according to claim 1, further comprising a step of forming a wet-etching termination layer for terminating a wet-etching within the cladding layer so that the wet-etching termination layer is sandwiched between a pair of cladding layers.

4. A method of manufacturing a semiconductor laser according to claim 3, wherein the wet-etching termination layer is made of InGaAsP or InGaAs.

5. A method of manufacturing a semiconductor laser according to claim 1, wherein said active layer is a bulk layer, a single quantum well layer, or a multiple quantum well layer mainly composed of $In_{1-x}Ga_xAs_{1-y}P_y$ (where $0 \leq x < 1$, $0 \leq y \leq 1$); and said cladding layer is made of InP.

6. A method of manufacturing a semiconductor laser according to claim 2, wherein said contact layer is made of InGaAsP or InGaAs.

7. A method of manufacturing a semiconductor laser according to claim 5, wherein said selective wet etching for said cladding layer of InP is performed using a hydrochloric acid type etchant.

8. A method of manufacturing a semiconductor laser according to claim 1, wherein said step of forming a grating mask includes;

a step of forming a protective film and a resist layer in this order to cover on said two lateral flat portions, the side walls of said ridge stripe and said stripe mask; and a step of forming a latent image of a grating mask having a periodic structure in the direction in which the ridge stripe extends on said resist layer and then forming a grating mask by developing said resist layer.

9. A method of manufacturing a semiconductor laser according to claim 8, wherein said step of forming the latent image includes the step of forming said latent image using a direct electron beam writing process.

10. A method of manufacturing a semiconductor laser according to claim 8, further comprising;

a step of removing said protective film and said stripe mask after the forming step of said grating;

a step of forming to form an insulator layer on an entire surface of said grating and said flat top portion; and performing etching to expose only said flat top portion on said insulator layer and, thereafter, forming an electrode on said flat top portion.

11. A method of manufacturing a semiconductor laser according to claim 1, wherein in the step of forming the stripe mask for the ridge stripe, the stripe mask is formed so that a longitudinal axis of the ridge stripe extends parallel to a crystal orientation <0$\bar{1}$1>-direction in crystal of the cladding layer of the laser substrate.

* * * * *